(12) United States Patent
Liu et al.

(10) Patent No.: US 9,000,555 B2
(45) Date of Patent: Apr. 7, 2015

(54) ELECTRONIC DEVICE INCLUDING SHALLOW TRENCH ISOLATION (STI) REGIONS WITH BOTTOM NITRIDE LINER AND UPPER OXIDE LINER AND RELATED METHODS

(75) Inventors: Qing Liu, Guilderland, NY (US);
Nicolas Loubet, Guilderland, NY (US);
Prasanna Khare, Schenectady, NY (US)

(73) Assignee: STMicroelectronics, Inc., Coppell, TX (US)

( * ) Notice: Subject to any disclaimer, the term of this patent is extended or adjusted under 35 U.S.C. 154(b) by 17 days.

(21) Appl. No.: 13/590,703

(22) Filed: Aug. 21, 2012

(65) Prior Publication Data

US 2014/0054698 A1 Feb. 27, 2014

(51) Int. Cl.
*H01L 21/70* (2006.01)
*H01L 21/762* (2006.01)

(52) U.S. Cl.
CPC .... *H01L 21/76283* (2013.01); *H01L 21/76202* (2013.01); *H01L 21/76264* (2013.01); *H01L 21/76224* (2013.01); *H01L 21/762* (2013.01)

(58) Field of Classification Search
CPC . H01L 21/76; H01L 21/762; H01L 21/76202; H01L 21/76224; H01L 21/76264

USPC ............ 257/347, E27.112, E21.32, E21.545, 257/E21.561, 501, E29.02, E21.564; 438/248, 294, 295, 296, 311, 359, 391, 438/702

See application file for complete search history.

(56) References Cited

U.S. PATENT DOCUMENTS

| | | | |
|---|---|---|---|
| 6,689,665 B1 * | 2/2004 | Jang et al. | 438/296 |
| 8,187,975 B1 | 5/2012 | Khare et al. | |
| 2005/0167778 A1 * | 8/2005 | Kim et al. | 257/510 |
| 2006/0214258 A1 * | 9/2006 | Kiyotoshi | 257/510 |
| 2007/0259500 A1 | 11/2007 | Cheng et al. | |
| 2009/0289279 A1 | 11/2009 | Khare | |
| 2011/0024840 A1 * | 2/2011 | Khater | 257/347 |
| 2012/0119296 A1 | 5/2012 | Anderson et al. | |
| 2013/0341754 A1 * | 12/2013 | Doris et al. | 257/506 |

* cited by examiner

*Primary Examiner* — Khiem D Nguyen
(74) *Attorney, Agent, or Firm* — Allen, Dyer, Doppelt, Milbrath & Gilchrist, P.A.

(57) ABSTRACT

An electronic device may include a substrate, a buried oxide (BOX) layer overlying the substrate, at least one semiconductor device overlying the BOX layer, and at least one STI region in the substrate and adjacent the at least one semiconductor device. The at least one STI region defines a sidewall surface with the substrate and may include a nitride layer lining a bottom portion of the sidewall surface, an oxide layer lining a top portion of the sidewall surface above the bottom portion, and an insulating material within the nitride and oxide layers.

23 Claims, 6 Drawing Sheets

ELECTRONIC DEVICE INCLUDING SHALLOW TRENCH ISOLATION (STI) REGIONS WITH BOTTOM NITRIDE LINER AND UPPER OXIDE LINER AND RELATED METHODS

FIELD OF THE INVENTION

The present invention relates to the field of electronic devices and, more particularly, to semiconductor devices and related methods.

JOINT RESEARCH AGREEMENT

The claimed configurations set forth herein were made as a result of activities undertaken within the scope of a joint research agreement. The parties to the joint research agreement are (1) STMicroelectronics, Inc., and (2) International Business Machines Corporation.

BACKGROUND OF THE INVENTION

Ultra-thin Body and Buried Oxide (BOX) devices (UTBB) are an attractive device structure in that they may allow for improved semiconductor device scaling. UTBB typically includes an ultra-thin Si body as a channel region, which is fully depleted and is beneficial for short channel effect (SCE) control. Also, with thinner BOX (about 25 nm or thinner), compared with ETSOI (extreme thin silicon-on-insulator) devices which have a thicker BOX (more than 50 nm), UTBB provides better scaling capability and the ability to tune threshold voltage (Vt) by applying reasonable back bias.

Shallow trench isolation (STI) regions are typically used in UTBB devices to electrically isolate the semiconductor devices (e.g., field effect transistors (FETs)) from one another. However, with the ultra-thin layers, typical processing operations may cause divots at the interface of the STI regions that can result in shorting from the device source/drain regions to the Si substrate.

Various approaches have generally been used for enhancing STI isolation structures. One such example is set forth in U.S. Pat. Pub. No. 2012/0119296 to Anderson et al., which is directed to trench-generated transistor structures wherein the source and drain of the transistor are defined by doped regions in the semiconductor material of the handle substrate of a semiconductor-on-insulator (SOI) wafer. The gate electrode may be defined from the semiconductor layer of the SOI wafer, which is separated from the handle wafer by an insulating layer.

Despite the existence of such configurations, further enhancements may be desirable for STI regions, particularly where relatively small dimensions are used, such as in UTBB devices.

SUMMARY OF THE INVENTION

In view of the foregoing, it is an object of the invention to provide an electronic device with enhanced interface characteristics between shallow trench isolation (STI) regions and corresponding semiconductor devices.

This and other objects, features, and advantages are provided by an electronic device which may include a substrate, a buried oxide (BOX) layer overlying the substrate, at least one semiconductor device overlying the BOX layer, and at least one STI region in the substrate and adjacent the at least one semiconductor device. The at least one STI region defines a sidewall surface with the substrate and may include a nitride layer lining a bottom portion of the sidewall surface, an oxide layer lining a top portion of the sidewall surface above the bottom portion, and an insulating material within the nitride and oxide layers. Accordingly, the STI regions(s) may advantageously reduce electrical shorting at an interface between the STI region(s) and the corresponding semiconductor device.

More particularly, the nitride layer may comprise a silicon nitride (SiN) layer, and the oxide layer may comprise a hafnium oxide ($HfO_2$) layer, for example. The oxide layer may extend above the BOX layer, and the nitride layer may terminate below the BOX layer, for example. Furthermore, an upper surface of the at least one STI region may be vertically above the BOX layer. In addition, the insulating material may be different than the nitride and oxide layers. By way of example, the insulating material may comprise silicon dioxide ($SiO_2$).

The at least one semiconductor device may comprise at least one field effect transistor (FET), for example. More specifically, the at least one FET may comprise raised source and drain regions and a channel region therebetween. In addition, the at least one STI region may comprise a plurality of STI regions on opposing sides of the at least one semiconductor device.

A related method is for making an electronic device which includes forming at least one STI region in a substrate having a BOX layer overlying the substrate. This is done by at least forming a trench in the substrate defining a sidewall surface with the substrate, lining a bottom portion of the sidewall surface with a nitride layer, lining a top portion of the sidewall surface above the bottom portion with an oxide layer, and depositing an insulating material within the nitride and oxide layers. The method further includes forming at least one semiconductor device overlying the BOX layer adjacent the at least one STI region.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
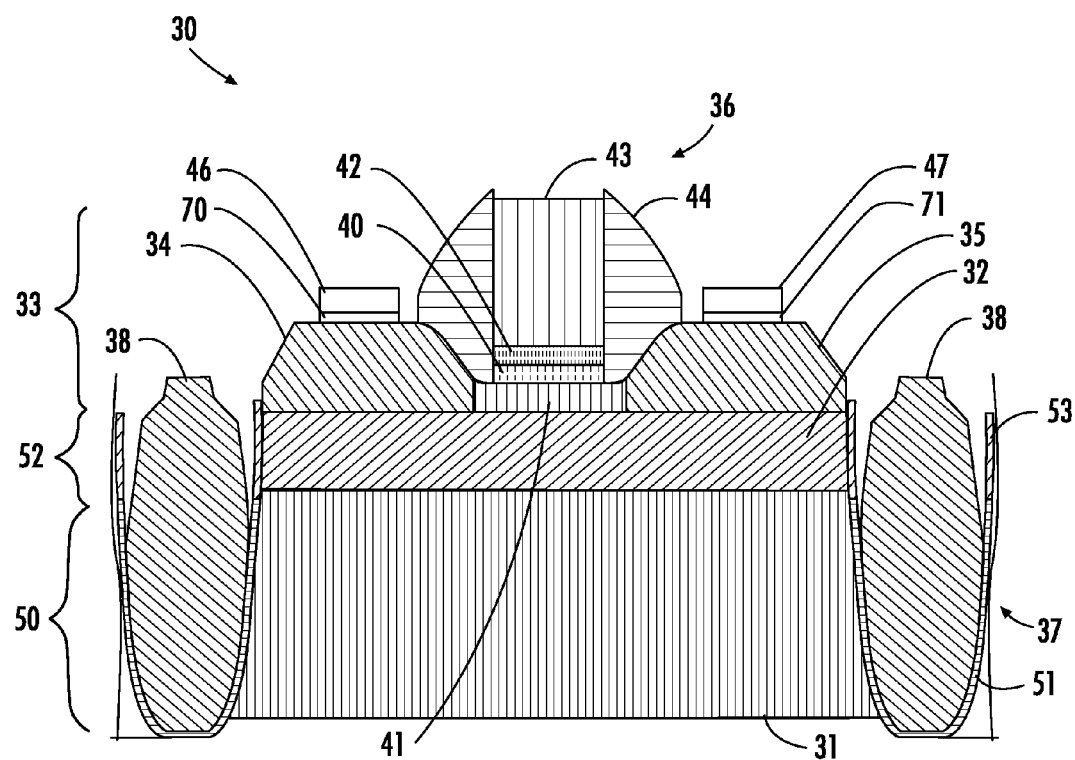
FIG. 1 is a schematic cross-sectional diagram of an electronic device in accordance with the invention including enhanced STI regions.

Referring initially to FIG. 1, an electronic device 30 is are first described. In the illustrated example, the electronic device 30 is a UTBB structure which illustratively includes a substrate 31, a buried oxide layer 32 overlying the substrate, and one or more semiconductor devices 33 overlying the BOX layer. In the illustrated example, the substrate 31 is a silicon substrate, although other suitable substrates (e.g., germanium, etc.) may also be used in different embodiments. Also, the semiconductor device 33 in the present example is a field effect transistor (FET) including raised source and drain regions 34, 35, and a gate 36. In a typical implementation, a plurality of semiconductor devices 33 (e.g., FETs) may be formed on a UTBB wafer, which are separated from one another by STI regions 37, as will be discussed further below. The raised source and drain regions 34, 35 may be of various types, such as intrinsic silicon, in-situ boron doped SiGe, in-situ phosphorus doped Si/SiC, etc.

The gate 36 illustratively includes a gate insulating layer 40, which overlies a channel layer 41, and a gate electrode 42 overlying the gate insulating layer. A gate contact 43 overlies the gate electrode layer 42. A dielectric sidewall spacer 44 is adjacent the gate contact layer 43 as shown. Respective source and drain silicide regions 70, 71, and contacts 46, 47 are on the raised source and drain regions 34, 35.

By way of background, due to the relatively thin BOX layer 32, UTBB devices may otherwise be susceptible to the HF cleaning used in CMOS device manufacturing. More particularly, the STI regions 37 are filled with an insulator 38, such as silicon dioxide ($SiO_2$), which may be recessed during HF cleaning, etc., creating a divot at the interface of the STI regions and the source/drain regions 34, 35. This can cause shorting from the source/drain regions 34, 35 to the substrate 31. For example, when depositing the silicide regions 70, 71 for the source and drain contacts 46, 47, silicide agglomeration may occur within the divots, which can cause shorting. Another potential cause of shorting is overgrowth of epitaxial silicon in the divots from formation of the raised source and drain regions 34, 35. Still another potential source of shorting may be an over etch/deposition of source/drain contact material for the contacts 46, 47 that carries over into the divots.

One technique that has been attempted to reduce this type of shorting is to form a robust STI liner. A crystallized hafnium oxide ($HfO_2$) STI liner is one material that has been used. This material has a strong resistance to many wet etchants, and also is strong enough to block the dry reactive ion etching (RIE) materials during the contact etch process upon annealing. However, the conventional approach is to deposit a $HfO_2$ liner and then simply fill the STI region 37 with an insulator such as $SiO_2$. Yet, this process may not be not stable, and it may also be too sensitive to subsequent Chemical Mechanical Polishing/Planarization (CMP) steps.

Figure 2:
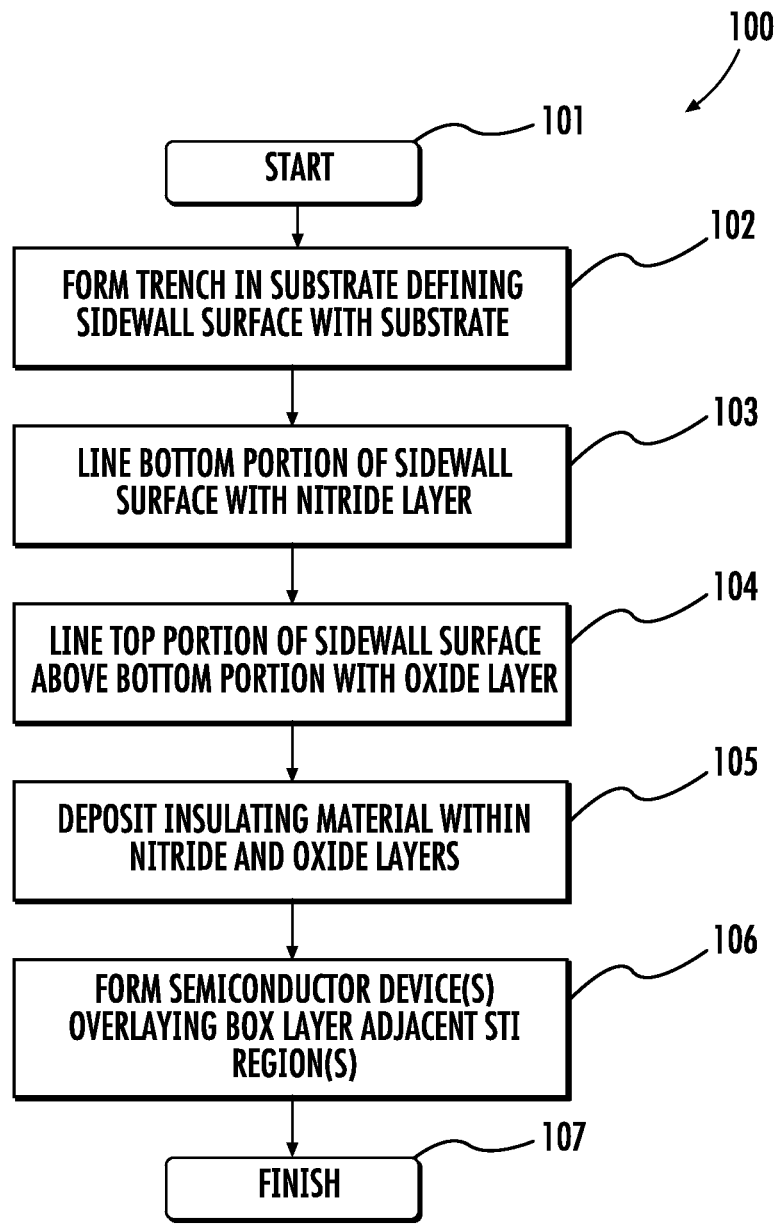
FIG. 2 is a flow diagram illustrating a method for making the electronic device of FIG. 1.

Referring additionally to FIG. 2, an example approach form making the UTBB electronic device 30 is first described. With reference to the flow diagram 100, beginning at Block 101, the method generally includes forming the STI regions 37 by forming a trench 62 (see FIG. 4) in the substrate 32 defining a sidewall surface with the substrate and the BOX layer 32, at Block 102, and lining a bottom portion 50 of the sidewall surface with a nitride layer 51 (e.g., SiN), at Block 103. The method further illustratively includes lining a top portion 52 of the sidewall surface above the bottom portion 50 with an oxide layer 53 (e.g., $HfO_2$), at Block 104, and depositing the insulating material 38 within the nitride and oxide layers, at Block 105. The method further includes forming the semiconductor device(s) 33 overlying the BOX layer 32 adjacent the STI regions 37, at Block 106, which concludes the method illustrated in FIG. 2 (Block 107).

Figure 3:
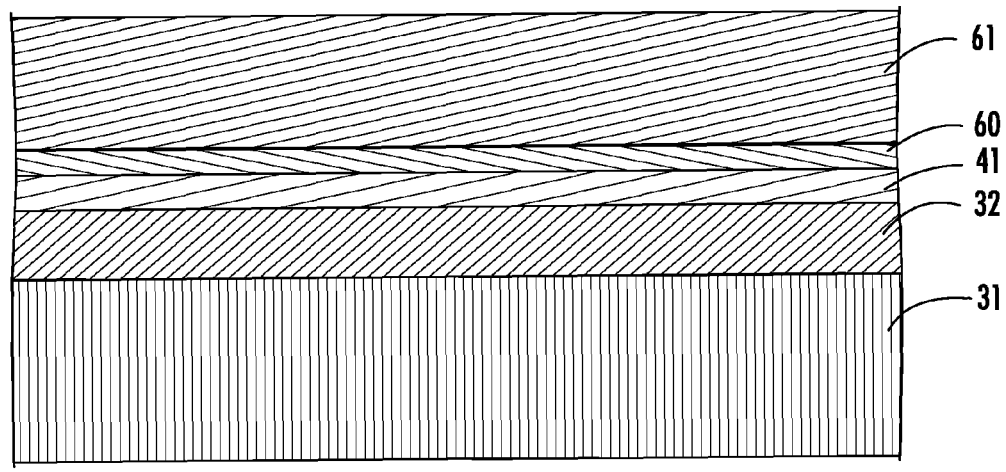
FIGS. 3-8 are a series of schematic cross-sectional diagrams illustrating method steps for making the electronic device of FIG. 1 in greater detail.

The fabrication process for the electronic device 30 will now be described in further detail with reference to FIGS. 3-8 and the flow diagram 110 of FIG. 9. Beginning at Block 111, the substrate 31, BOX layer 32, and ultra thin silicon layer 41 (which is later patterned to provide the channel) may be provided as a UTBB wafer in some embodiments. A pad oxide layer 60 may be formed overlying the silicon layer 41, and an SiN film 61 is deposited on the SiN film, at Block 112 (FIG. 3). By way of example, the SiN film 61 may have a thickness in a range of about 50 to 80 nm, the pad oxide layer 60 may have a thickness of about 5 nm, and the silicon layer 41 may have a thickness of about 10 nm or less, although other dimensions may be used in different embodiments.

Figure 4:
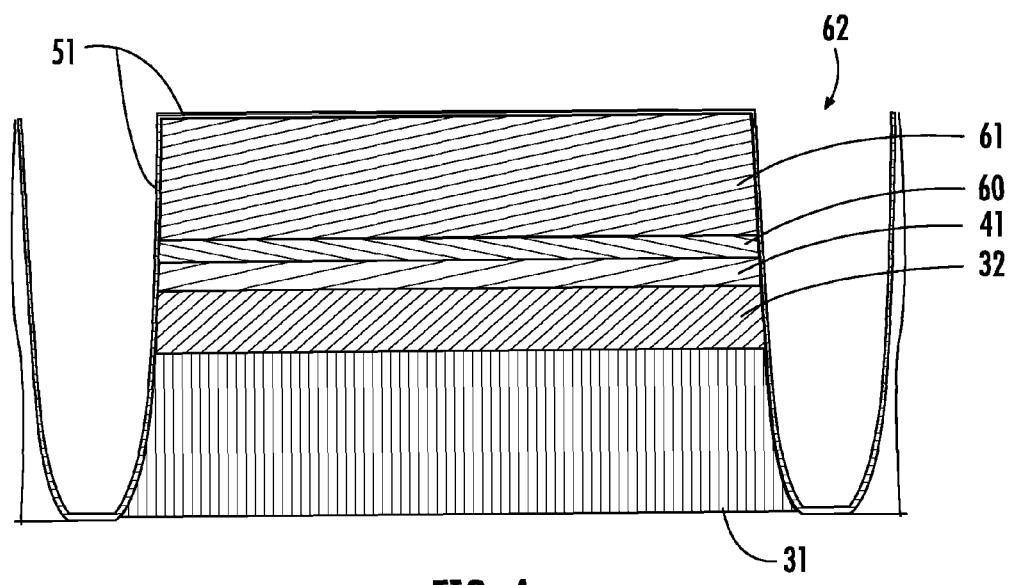
Figure 5:
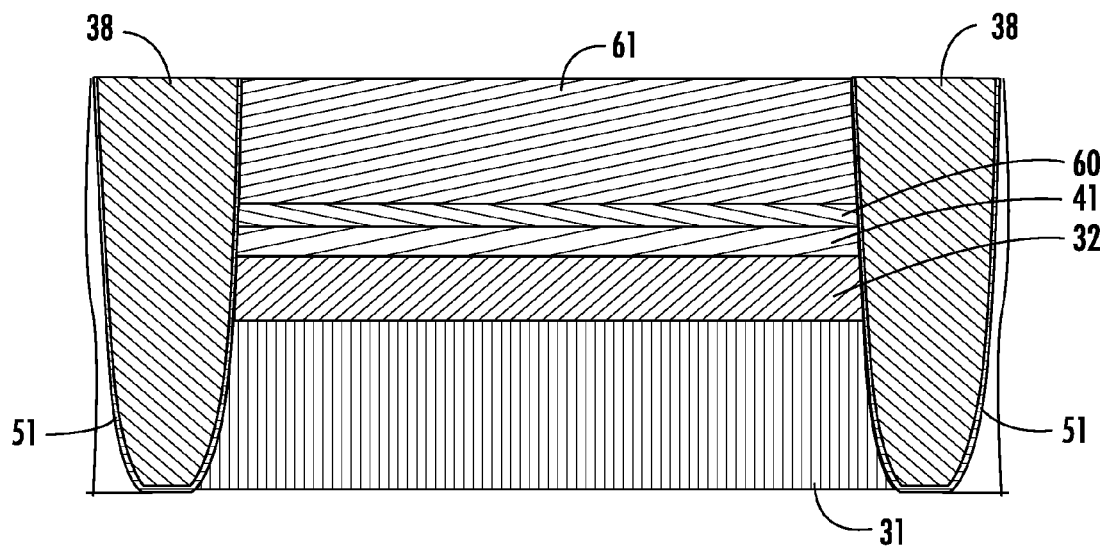
Figure 6:
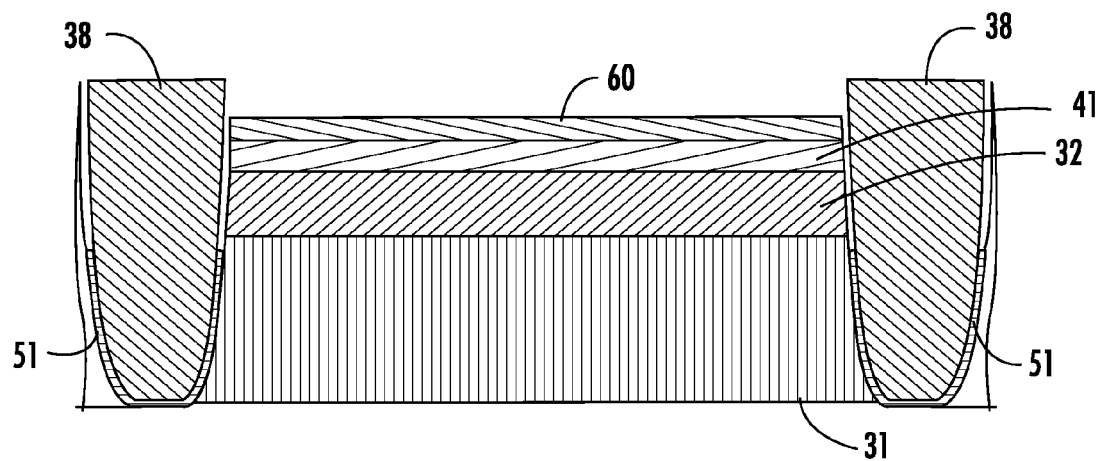

Lithography may then be performed to define and protect an active (RX) region, so that trenches 62 may be etched for the STI regions 37, at Block 113. A conformal SiN liner 51 may then be deposited within the trenches 62 and over the SiN film 61, at Block 114 (FIG. 4). The lined trenches 62 are then filled with the insulator 38 (Block 115), e.g., using a High Aspect Ratio Process (HARP) $SiO_2$ deposition, although other suitable insulators may be used in different embodiments. An anneal step is performed, at Block 116, which may be a relatively high temperature anneal (e.g., 1050-1150° C.) for HARP $SiO_2$. A CMP step may then be performed to planarize down to the level of the SiN film 61, at Block 117 (FIG. 5). HF acid may then be used for deglazing, which will remove any residuals left on the SiN layer 61, at Block 118, followed by a hot phosphoric acid etch (e.g., $H_3PO_4$) to remove the SiN layer, at Block 119 (FIG. 6). The HF deglazing will also etch the STI region 37 and reduce the insulating material 38 somewhat. Moreover, the hot phosphoric acid will also penetrate into the SiN liner 51 and remove the SiN from the upper portion 52 of the trenches 62. This will leave a gap at the sidewall interface between the active region and the STI region 37, as seen in FIG. 6. As a result, the upper portion of the trench 62 (and thus the $HfO_2$ layer 63) may be vertically above the BOX layer 32, and the SiN layer 51 may terminate below the BOX layer (i.e., so the $HfO_2$ layer extends from below the BOX layer to above the BOX layer for enhanced protection against shorting).

Figure 7:
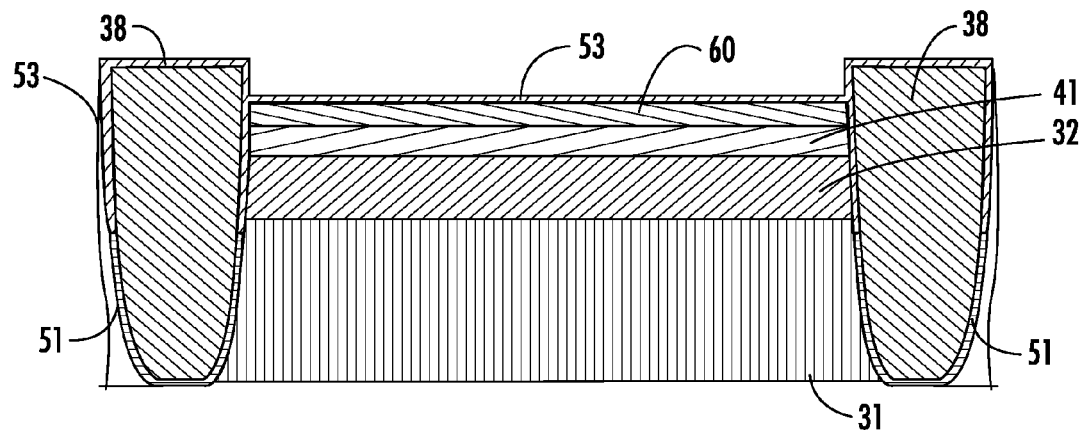

A conformal $HfO_2$ layer 53 is then deposited to fill the gaps caused by the etch of the SiN liner 51, at Block 120 (FIG. 7). It will therefore be appreciated that the $HfO_2$ liner 53 is deposited after the CMP processing described above at Block 117, rather than before, which reduces CMP variation in the $HfO_2$ liner. That is, since CMP processing is performed prior to formation of the $HfO_2$ liner 53, there will be no divots in the $HfO_2$ liner that are caused by the CMP processing, as noted above.

Figure 8:
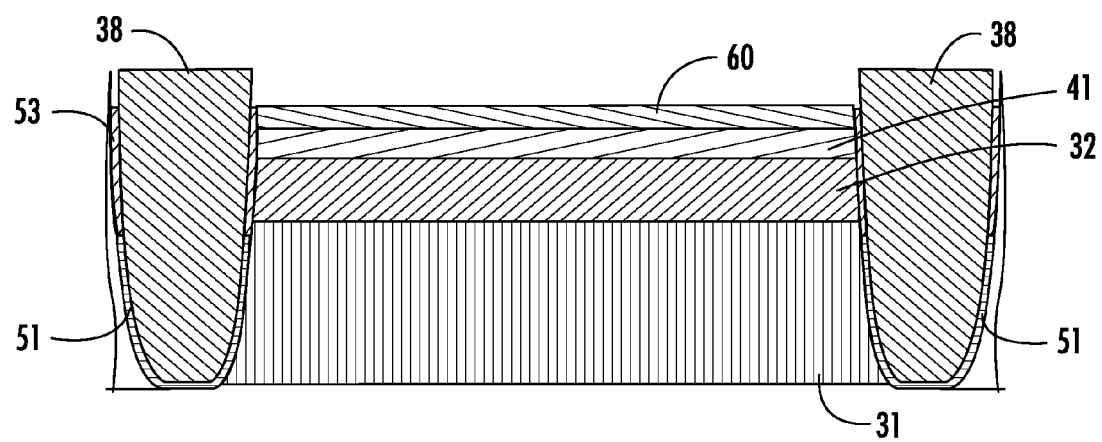
Figure 9:
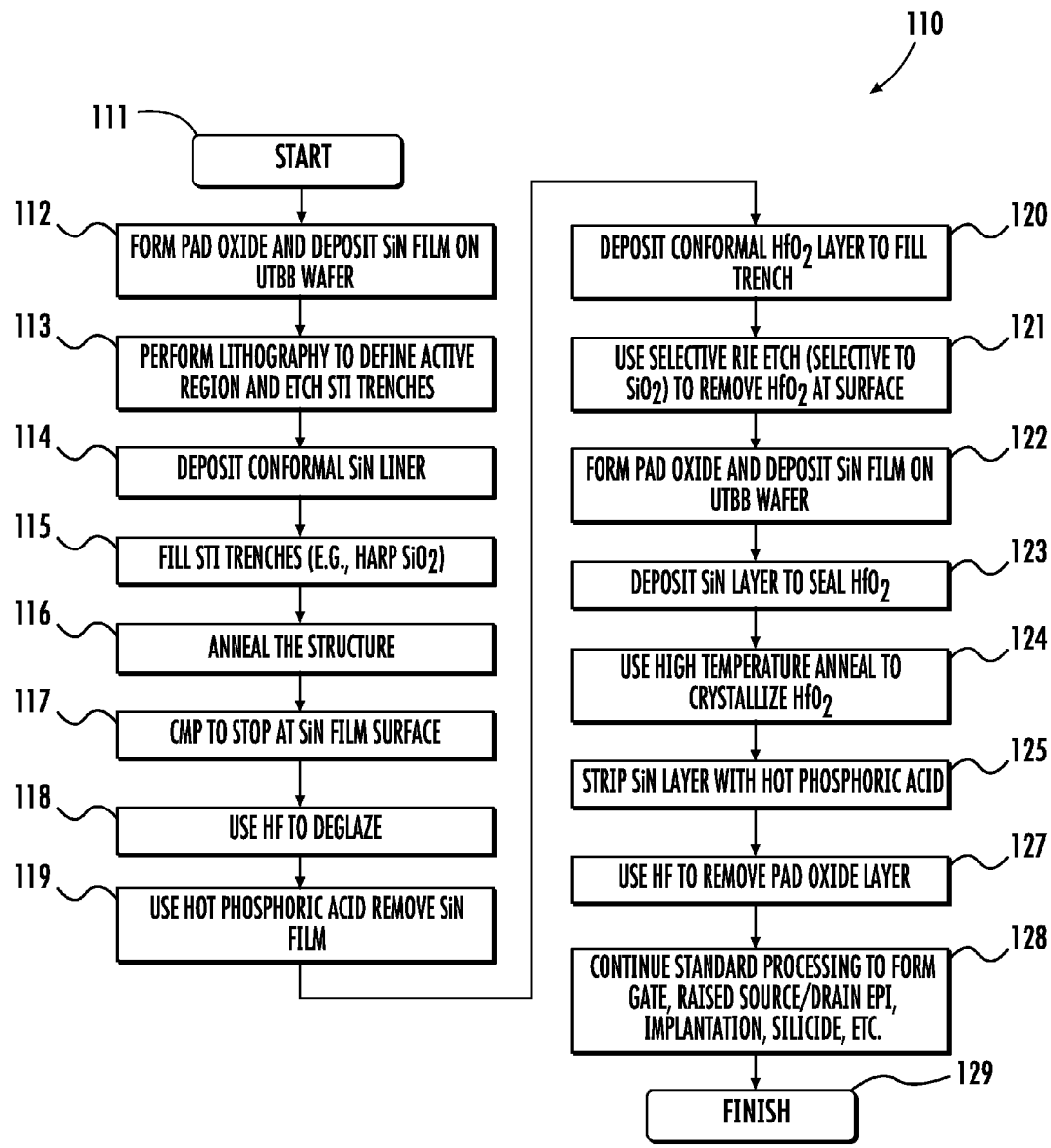
FIG. 9 is a flow diagram which corresponds to the methods steps shown in FIGS. 3-8.

A selective RIE etch (i.e., selective to $SiO_2$) may then be used to remove $HfO_2$ from the surface of the pad oxide layer 60, at Block 121 (FIG. 8). The RIE etch may be performed so that the $HfO_2$ layer 53 inside the trench 62 will remain mostly intact. An SiN sealing film (not shown) may then be deposited to seal the $HfO_2$ layer 53 within the trenches 62, at Block 123, followed by a high temperature anneal to crystallize the $HfO_2$ and provide a robust liner in terms of both wet and dry etch resistance, at Block 124. More particularly, the crystallization of the $HfO_2$ layer 53 at the substrate interface may be accomplished with a conventional well annealing step that is typically performed, and thus no extra annealing step need be performed in such embodiments.

Another hot phosphoric acid etc may then be used to remove the SiN sealing film, at Block 125, followed by an HF etch to remove the pad oxide layer 60, at Block 127. Again, at this point the $HfO_2$ liner 53 is very resistant to HF acid, and therefore less susceptible to divot formation. Further conventional processing steps may then be performed to form the gate 36, raised source/drain regions 34, 35, silicide regions 70, 71, and contacts 46, 47, and complete the semiconductor device 33 shown in FIG. 1, at Block 128, which concludes the method illustrated in FIG. 9 (Block 129).

The above-described approach accordingly provides desired control of the STI surface across the wafer, and from wafer to wafer, and may be comparable to standard STI formation processes. Moreover, there is a relatively small change required to the standard STI formation process, with only the few additional steps described above being added. Furthermore, it should be noted that the upper surface of the STI regions 37 may be above the active region (i.e., above the BOX layer 32), which may otherwise be hard to control in a conventional $HfO_2$ liner formation process as described above.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. An electronic device comprising:
a substrate;
a buried oxide (BOX) layer overlying said substrate;
at least one semiconductor device overlying said BOX layer; and
at least one shallow trench isolation (STI) region in the substrate and adjacent the at least one semiconductor device, said at least one STI region defining a sidewall surface with the substrate and comprising
a nitride layer lining a bottom portion of the sidewall surface,
an oxide layer lining a top portion of the sidewall surface above the bottom portion, and
an insulating material overlying the nitride and oxide layers and extending vertically above the oxide layer.

2. The electronic device of claim 1 wherein the nitride layer comprises a silicon nitride (SiN) layer.

3. The electronic device of claim 1 wherein the oxide layer comprises a hafnium oxide ($HfO_2$) layer.

4. The electronic device of claim 1 wherein said oxide layer extends above said BOX layer.

5. The electronic device of claim 1 wherein said nitride layer terminates below said BOX layer.

6. The electronic device of claim 1 wherein said insulating material is different than the nitride and oxide layers.

7. The electronic device of claim 1 wherein an upper surface of said at least one STI regions is vertically above said BOX layer.

8. The electronic device of claim 1 wherein said insulating material comprises silicon dioxide ($SiO_2$).

9. The electronic device of claim 1 wherein said at least one semiconductor device comprises at least one field effect transistor (FET).

10. The electronic device of claim 9 wherein said at FET comprises raised source and drain regions and a channel region therebetween.

11. The electronic device of claim 1 wherein said at least one STI region comprises a plurality of STI regions on opposing sides of said at least one semiconductor device.

12. An electronic device comprising:
a substrate;
a buried oxide (BOX) layer overlying said substrate;
at least one semiconductor device overlying said BOX layer; and
at least one shallow trench isolation (STI) region in the substrate and adjacent the at least one semiconductor device, said at least one STI region defining a sidewall surface with the substrate and comprising
a silicon nitride (SiN) layer lining a bottom portion of the sidewall surface,
a hafnium oxide ($HfO_2$) layer lining a top portion of the sidewall surface above the bottom portion, and
an insulating material overlying the SiN and $HfO_2$ layers and extending vertically above the $HfO_2$ layer.

13. The electronic device of claim 12 wherein said $HfO_2$ layer extends above said BOX layer.

14. The electronic device of claim 12 wherein said SiN layer terminates below said BOX layer.

15. The electronic device of claim 12 wherein said insulating material is different than the nitride and oxide layers.

16. A method for making an electronic device comprising:
forming at least one shallow trench isolation (STI) region in a substrate having a buried oxide (BOX) layer overlying the substrate by at least
forming a trench in the substrate defining a sidewall surface with the substrate,
lining a bottom portion of the sidewall surface with a nitride layer,
lining a top portion of the sidewall surface above the bottom portion with an oxide layer, and
depositing an insulating material overlying the nitride and oxide layers and extending vertically above the oxide layer; and
forming at least one semiconductor device overlying the BOX layer adjacent the at least one STI region.

17. The method of claim 16 wherein lining the bottom portion of the sidewall surface further comprises:
lining the trench with the nitride layer; and
etching away the nitride layer down to the bottom portion.

18. The method of claim 16 further comprising performing chemical-mechanical planarization (CMP) prior to lining the top portion of the sidewall surface with the oxide layer.

19. The method of claim 16 wherein the nitride layer comprises a silicon nitride (SiN) layer.

20. The method of claim 16 wherein the oxide layer comprises a hafnium oxide ($HfO_2$) layer.

21. The method of claim 16 wherein the oxide layer extends above the BOX layer.

22. The method of claim 16 wherein the nitride layer terminates below the BOX layer.

23. The method of claim 16 wherein the insulating material is different than the nitride and oxide layers.

* * * * *